United States Patent [19]

Brichta et al.

[11] Patent Number: 5,561,353
[45] Date of Patent: Oct. 1, 1996

[54] CATHODE PULSE MODULATION OF RF TRANSMITTER TUBES

[75] Inventors: Donald A. Brichta, Western Spring; Robert M. Zawislak, Palatine; Neils A. Kruse, Cary, all of Ill.

[73] Assignee: Northrop Grumman Corporation, Los Angeles, Calif.

[21] Appl. No.: 315,367

[22] Filed: Sep. 30, 1994

[51] Int. Cl.$^6$ ................................................. H01J 11/04
[52] U.S. Cl. ...................... 315/349; 315/350; 315/351; 315/366; 315/3.5; 332/134
[58] Field of Search ........................ 315/344, 349, 315/350, 351, 366, 3.5, 3.6; 330/43, 44; 332/106, 134; 313/591, 592

[56] References Cited

U.S. PATENT DOCUMENTS

| | | | |
|---|---|---|---|
| 2,265,669 | 12/1941 | Paehr | 178/7.5 |
| 2,577,578 | 12/1951 | Hadfield | 250/27 |
| 2,824,959 | 2/1958 | Johnson | 250/27 |
| 3,023,364 | 2/1962 | Firth | 328/252 |
| 3,064,198 | 11/1962 | Hobrough | 328/109 |
| 3,100,873 | 8/1963 | Marks | 328/165 |
| 3,268,822 | 8/1966 | Hickey | 328/67 |
| 3,457,517 | 7/1969 | Johnston et al. | 328/231 |
| 3,806,836 | 4/1974 | Alsmeyer | 332/13 |
| 3,812,395 | 5/1974 | Scott | 315/3.6 X |
| 3,886,460 | 5/1975 | Wilson | 328/109 |
| 3,903,450 | 9/1975 | Forbess et al. | 315/31 R |
| 4,272,737 | 6/1981 | Molyneux-Berry | 332/1 |
| 4,323,853 | 4/1982 | Kurokawa | 315/3.6 X |
| 4,370,597 | 1/1983 | Weiner et al. | 315/58 |
| 4,728,809 | 3/1988 | Fisher et al. | 307/106 |
| 4,797,626 | 1/1989 | Honda et al. | 328/225 |
| 4,877,996 | 10/1989 | van Houwelingen et al. | 313/592 |
| 4,897,619 | 1/1990 | Patron et al. | 331/167 |
| 4,950,962 | 8/1990 | Birnbach et al. | 315/351 |
| 5,038,051 | 8/1991 | Firman et al. | 307/106 |
| 5,140,230 | 8/1992 | Tomii et al. | 315/366 |
| 5,150,018 | 9/1992 | Bruning et al. | 315/349 |

*Primary Examiner*—Robert Pascal
*Assistant Examiner*—Haissa Philogene
*Attorney, Agent, or Firm*—Terry J. Anderson; Karl J. Hoch, Jr.

[57] ABSTRACT

Beam control pulse modulation in an RF transmitter tube is provided by a solid state switch connected between the cathode power supply and the cathode of the transmitter tube. The beam controlling element is returned to the normal cathode power source such that closing the switch between the cathode and the cathode power source brings the beam controlling element voltage to cathode potential causing beam current to flow, while opening the switch provides a very high equivalent cathode resistance, which self-biases the tube in the cutoff region, eliminating the need for a separate "off" voltage power supply. Off-edge performance may be further improved by providing an off switch connected between the cathode and a collector tap on the cathode power supply, and closing the switch when the on switch is opened to accelerate return of the cathode potential to the cutoff voltage.

10 Claims, 4 Drawing Sheets

CATHODE PULSE MODULATION OF RF TRANSMITTER TUBES

BACKGROUND OF INVENTION

1. Field of the Invention

The present invention relates to a transmitter tube of the type designed to transmit radio frequency (RF) radiation, including microwaves, and in particular to a high power transmitter tube in which beam control pulse modulation is accomplished by (1) connecting the control electrode directly to the cathode power supply, and (2) connecting a solid state switch between the cathode power supply and the cathode of the transmitter tube. Closing of the solid state switch brings the beam controlling element voltage to cathode potential, permitting an electrode beam emitted by the cathode to reach a collecting electrode or electrodes of the transmitter tube, while opening of the switch provides a very high equivalent cathode resistance, which self-biases the tube in the cutoff region and cuts off the beam to form a pulse. The invention also relates to a method of beam control pulse modulation for a transmitter tube, in which the beam controlling element is returned to the cathode power supply and a solid state switch is connected between the cathode power supply and the cathode of the transmitter tube.

2. Description of Related Art

Transmitter tubes are currently used in a wide variety of applications, including satellite communications, electronic countermeasures, radar transmitters, medical x-ray source control, and so forth. Most transmitter tubes consist of a cathode which emits electrons when the energy of the surface atoms of the cathode is raised, and one or more electrodes for collecting the emitted electrons and for establishing variable electric fields in order to control the movement of the electrons between the emitting electrode and the collecting electrode or electrodes. While magnetic fields may be used to control movements of the electrons being emitted by the cathode, control by electric fields has a number of advantages and is the basis for the type of transmitter tube to which the present invention is directed, in which the primary source of electrons is thermionic emission from the cathode and control is by electric fields generated by at least one control electrode.

Those skilled in the art will appreciate, however, that even though the invention is described in terms of a particular type of transmitter tube, it is adaptable for use with a variety of different tube configurations, and that the description herein of a particular type of transmitter tube in connection with a preferred embodiment is to be taken as illustrative rather than limiting.

Specifically, the preferred embodiment of the invention is described in terms of a type of thermionic vacuum tube known as a travelling wave tube (TWT), commonly used for microwave frequency transmissions in radar systems, and in which the control electrode is known as the "focusing electrode." Other transmitter tubes use a type of control electrode known as a "grid." As will become apparent from the detailed description, the invention is equally applicable to transmitter tubes having control electrodes in the form of focusing electrodes, grids, or any combination thereof, and may also be applicable to other types of tubes, so long as a control electrode and cathode are present.

Whether the control electrode is in the form of a grid or focusing electrode, the purpose of the control electrode is to generate an electric field which modulates the amount or direction of electrons emitted by the cathode, with the strength of the control field relative to the cathode field and the energy of the electrons emitted by the cathode determining how many of the emitted electrons reach the collecting electrode(s) or anode. In a typical arrangement in which the control electrode is adjacent the cathode, for example, when the control electrode is at the cathode potential, the control electrode will have little or no effect on the electrons emitted by the cathode. On the other hand, if the voltage of the control electrode is sufficiently large relative to the cathode voltage, all or most electrons will deflected or prevented from leaving the cathode, and the electron beam will be effectively cut-off. This potential difference between the control electrode and the cathode is known as the tube cutoff voltage.

In a pulse modulated transmitter tube, the desired output is in the form of pulses which are conveniently generated by switching the voltage of the control electrode between the cathode potential and the cutoff voltage. In a high power transmitter tube, such as the travelling wave tube whose characteristics are illustrated in FIG. 2, the cathode is at a very high negative voltage, which typically ranges from 2000 Vdc to 20,000 Vdc, so as to provide sufficient energy to accelerate the emitted electrons. In FIG. 2, the line indicated by solid squares (10) represents the current (Ik) emitted by the cathode as a function of the cathode to control electrode (Vfe) potential for a conventional travelling wave transmitter tube, in which the cathode voltage is at −3700 V (the open square line (20) represents an application of the present invention and will be discussed below). As is apparent from this FIGURE, the potential difference between the control electrode and the cathode in the conventional transmitter tube must be approximately 1280 volts in order to bring the cathode current (Ik) to zero.

Control of the conventional transmitter thus requires, as illustrated in FIG. 1, a power source 1 of −3700 volts for the cathode 2, a control electrode power source 7 for establishing a cutoff voltage of −1280 volts by supplying the cutoff voltage to the control electrode 4, an ON switch 5 for connecting the control electrode 4 to the cathode high voltage power source (HVPS) 1 for decreasing the control electrode to cathode potential to zero in order to permit emission of electrons from the cathode (see the point (0, 180) in FIG. 2), and an OFF switch 6 for connecting the control electrode 4 to the control electrode power source 7 in order to raise the control electrode 4 to the cutoff potential and switch off the beam of electrons being emitted by the cathode 2 to terminate a pulse. Pulse modulation is thus achieved by toggling of either the OFF or ON switches 5 and 6 in order to activate and deactivate the beam current of the transmitter tube 8 and thereby generate a pulse train.

Although the above-described conventional type of transmitter tube pulse modulation can provide an RF transmitter tube with adequate beam current control, and is widely used in both military and civilian applications, the conventional arrangement has a number of shortcomings, which those skilled in the art have heretofore been unable to solve. These include:

1. The circuit complexity resulting from the high voltages at which conventional transmitter tubes of the type illustrated in FIGS. 1 and 2 operate in turn results in increased weight and higher volume packaging, which is especially critical in the case of airborne equipment such as airborne radar transmitters;

2. The conventional circuitry operates at an increased stress level which reduces overall reliability;

3. Conventional control arrangements for the control electrode result in an appreciable increase in tube cut-off voltage; and 4. As illustrated in FIG. 1, conventional transmitter tubes require an additional off-bias voltage power supply, which add to both the weight and volume of the transmitter packaging.

It is known to control the cathode of other types of tubes by modulating the cathode potential as disclosed, for example, in U.S. Pat. No. 5,038,051, directed to a circuit which replaces a tetrode switch tube for modulating a cross field amplifier of a microwave transmitter tube. However, this type of cathode control is not analogous to the cathode control provided by the present invention, but rather involves switching the cathode voltage completely on and off, which in the example illustrated by FIG. 2 would involve switching the cathode between a voltage of 0 V and −3700 V. The solution offered by this patent in fact involves a relatively complicated circuit due to the high voltages involved. In contrast, as explained in more detail below, the present invention involves switching the cathode potential by an amount approximately equal to the cut-off potential, which in the example shown in FIG. 2, is approximately −1280 V for control electrode modulation and even less for the cathode modulation of a preferred embodiment of the invention (for reasons to be explained below). The present invention, which involves directly connecting the control electrode of a transmitter tube to the cathode power supply and selectively connecting the cathode to its power supply to reduce the potential difference between the cathode and the control electrode from the cut-off voltage to zero, is therefore completely different from the type of circuitry disclosed in U.S. Pat. No. 5,038,051, as well as from the type of control electrode modulated transmitter tube arrangement illustrated in FIGS. 1 and 2 and also disclosed, for example, in U.S. Pat. Nos. 4,728,809 and 4,877,996.

SUMMARY OF THE INVENTION

It is accordingly an objective of the invention to provide a simplified, high speed modulation circuit for a transmitter tube with sufficient reliability for both military and civilian applications, and which provides a means to digitally or pulse control the beam current of a transmitter tube with minimum circuitry at relatively low voltages while providing maximum performance.

These objectives are accomplished by providing a transmitter tube of the type designed to transmit radio frequency (RF) radiation, including microwaves, and in particular to a high power transmitter tube in which beam control pulse modulation is accomplished by (1) connecting the control electrode directly to the cathode power supply, and (2) connecting a solid state switch between the cathode power supply and the cathode of the transmitter tube. Closing of the solid state switch brings the beam controlling element voltage to cathode potential, permitting an electrode beam emitted by the cathode to reach a collecting electrode or electrodes of the transmitter tube, while opening of the switch provides a very high equivalent cathode resistance, which self-biases the tube in the cutoff region and cuts off the beam to form a pulse.

The objectives of the invention are also accomplished by providing a method of beam control pulse modulation for a transmitter tube, in which the beam controlling element is returned to the cathode power supply and a solid state switch is connected between the cathode power supply and the cathode of the transmitter tube, and in which modulation is achieved by selectively closing the switch bring the cathode voltage to that of the beam controlling element, which causes beam current to flow, and opening the switch to self-bias the tube to provide a high equivalent cathode resistance, which self-biases the tube in the cut-off region. By utilizing the self-bias capabilities of the circuit, the need for a cumbersome "off" voltage power supply is eliminated.

According to a particularly advantageous embodiment of the invention, the on switch is a transistor having a rapid turn-on time and a separate off switch connected to a tap on the cathode power supply is provided to compensate for the relatively slow turn-off time of the transistor used as the on switch. Those skilled in the art will appreciate that this off-switch is used for a different purpose than the off switch illustrated in FIG. 1, which connects the beam control electrode to an off bias power supply in order to raise the control electrode potential to the cut-off potential, rather than simply increasing the effective turn-off time for the switch connecting the cathode to its power supply. The off switch is also preferably in the form of a transistor and is connected to switch on when the main on switch is turned off, for example by the trailing edge of a control pulse. This embodiment has the additional advantage that the tube cut-off voltage requirements are actually significantly reduced since the accelerating potential in the cut-off mode is reduced by the voltage across the off-switch.

This latter advantage, resulting from the effect of the voltage drop across the off-switch, is illustrated in FIG. 2, in which the line 20 indicated by open squares represents the cathode current $I_k$ for a cathode connected according to the embodiment of the invention which includes both an on and an off switch, in relation to the potential difference between the transmitter tube cathode and the control electrode. A zero cathode current $I_k$ is achieved at −950 volts with the focus electrode at −3700 volts using the preferred embodiment, while as noted above the prior art arrangement illustrated by open blocks achieves a zero cathode current $I_k$ at approximately −1280 volts with the TWT cathode at −3700 volts. The tube control electrode operating voltage is thus reduced by 330 volts, thereby reducing stress on high voltage components and reducing risks associated with high voltages.

DETAILED DESCRIPTION OF THE PREFERRED EMBODIMENTS

Figure 1:
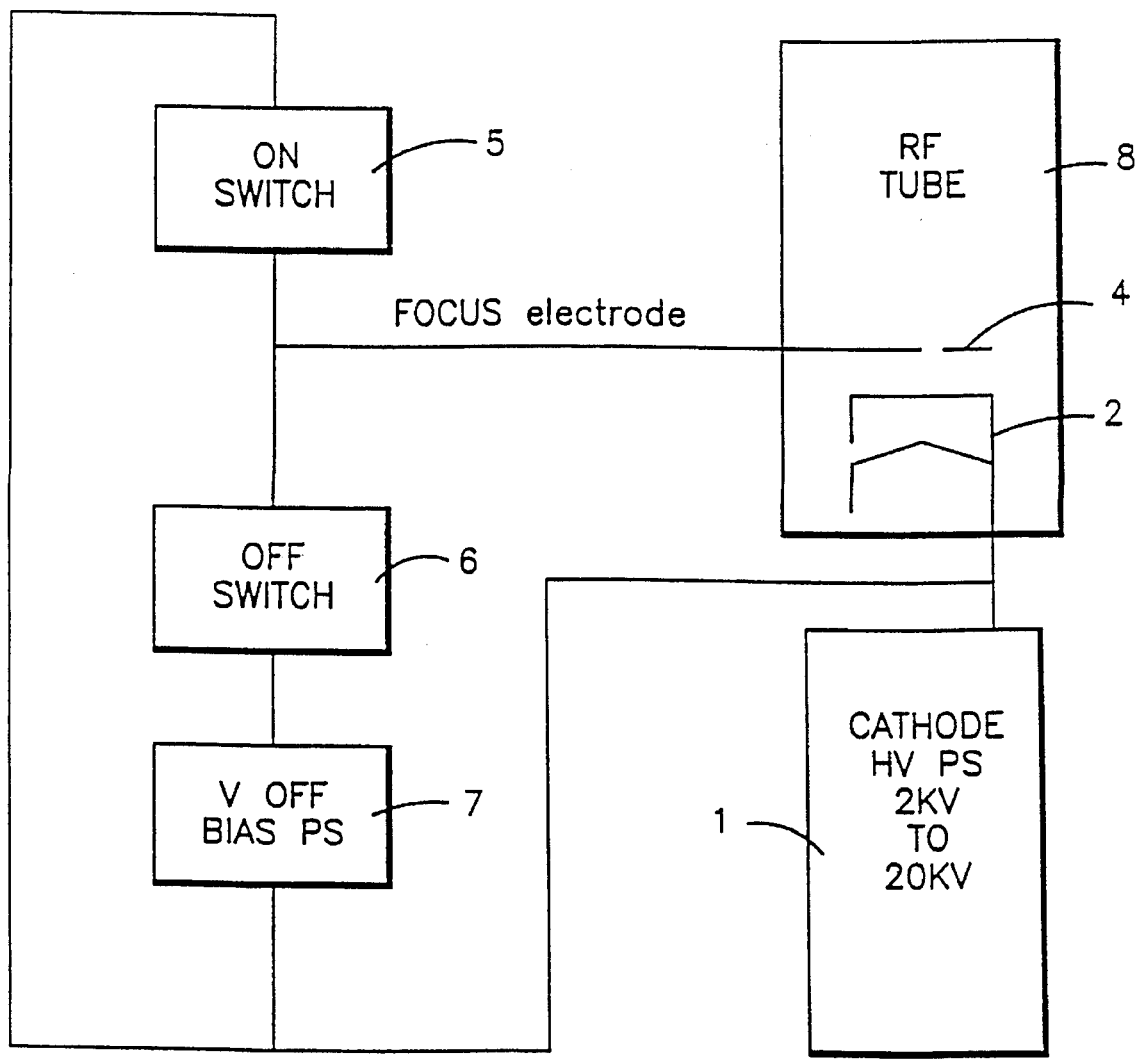
FIG. 1 is a block diagram of a transmitter tube having a focus electrode element modulator according to the prior art.
Figure 2:
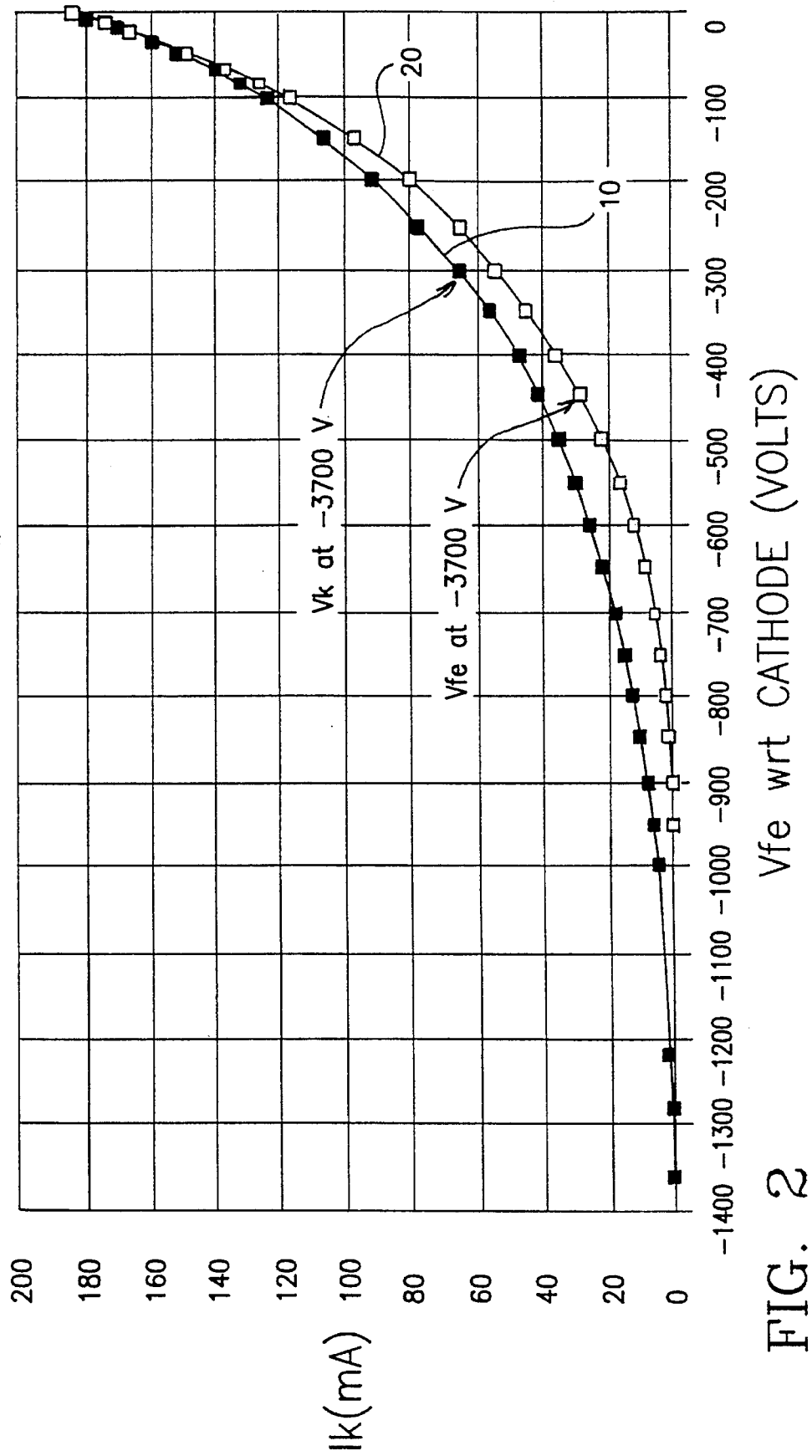
FIG. 2 is a graph of beam cut-off characteristics provided by the modulator arrangement of the preferred embodiment of the invention and by the conventional modulation technique.
Figures 3A, 3B:
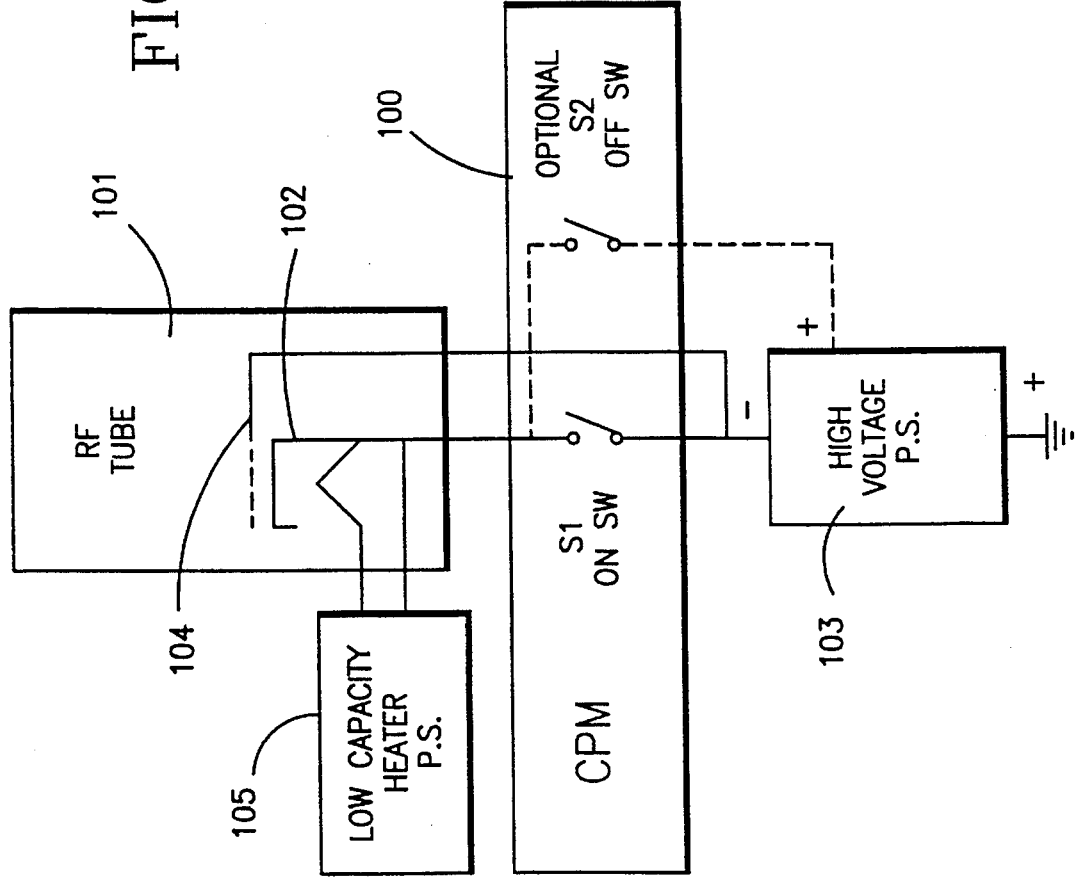
FIG. 3A is a schematic block diagram showing the principles of a preferred embodiment of the invention.
FIG. 3B is a waveform illustration of the manner in which the inclusion of an optional "off" switch in the preferred cathode pulse modulation circuit of FIG. 3 improves performance.

FIG. 3A is a schematic block diagram of a transmitter tube pulse modulation arrangement according to a preferred embodiment of the invention. As shown in FIG. 3A, the preferred cathode pulse modulator (CPM) arrangement 100 includes a single main on switch S1 for controlling the cathode 102 of a transmitter tube 101 of the type designed to transmit radio frequency (RF) radiation, including microwaves, such as a travelling wave tube. Main on switch S1 is connected between the transmitter tube cathode 102 and a cathode power supply 103. The control electrode 104, illustrated as a "focus" electrode, is returned directly to the cathode power supply. Also included in the cathode pulse modulator 105 is a conventional low capacity heater power supply 105 which has no effect on the basic principles of the invention and is included in FIG. 3A only for the sake of completeness.

In this embodiment, beam control pulse modulation is accomplished using the main on switch S1 by closing the switch to bring the voltage of beam controlling element 104 to cathode potential, permitting an electrode beam emitted by the cathode to reach a collecting electrode or electrodes (not shown) of the transmitter tube, and opening the switch to provide a very high equivalent cathode resistance, which self-biases the tube 101 in the cutoff region and cuts off the beam to form a pulse.

In the situation where switch S1 has a rapid turn-on time in the nanosecond range, but a relatively slow microsecond turn-off time is undesireable, an optional second switch S2, also shown in FIG. 3A, may be included for the purpose of providing more rapid turn-off times and which utilizes a portion of the existing cathode power supply, such as a collector tap, to increase performance. Those skilled in the art will appreciate that the cathode power supply is usually, due to the high voltages required, in the form of a series-connected arrangement of individual power supplies, with the collector tap involving a connection between the individual power supplies at a voltage less than the cathode on voltage. The effect of the optional second switch S2 on an output pulse of the transmitter tube 100 is illustrated in FIG. 3B.

Figure 4:
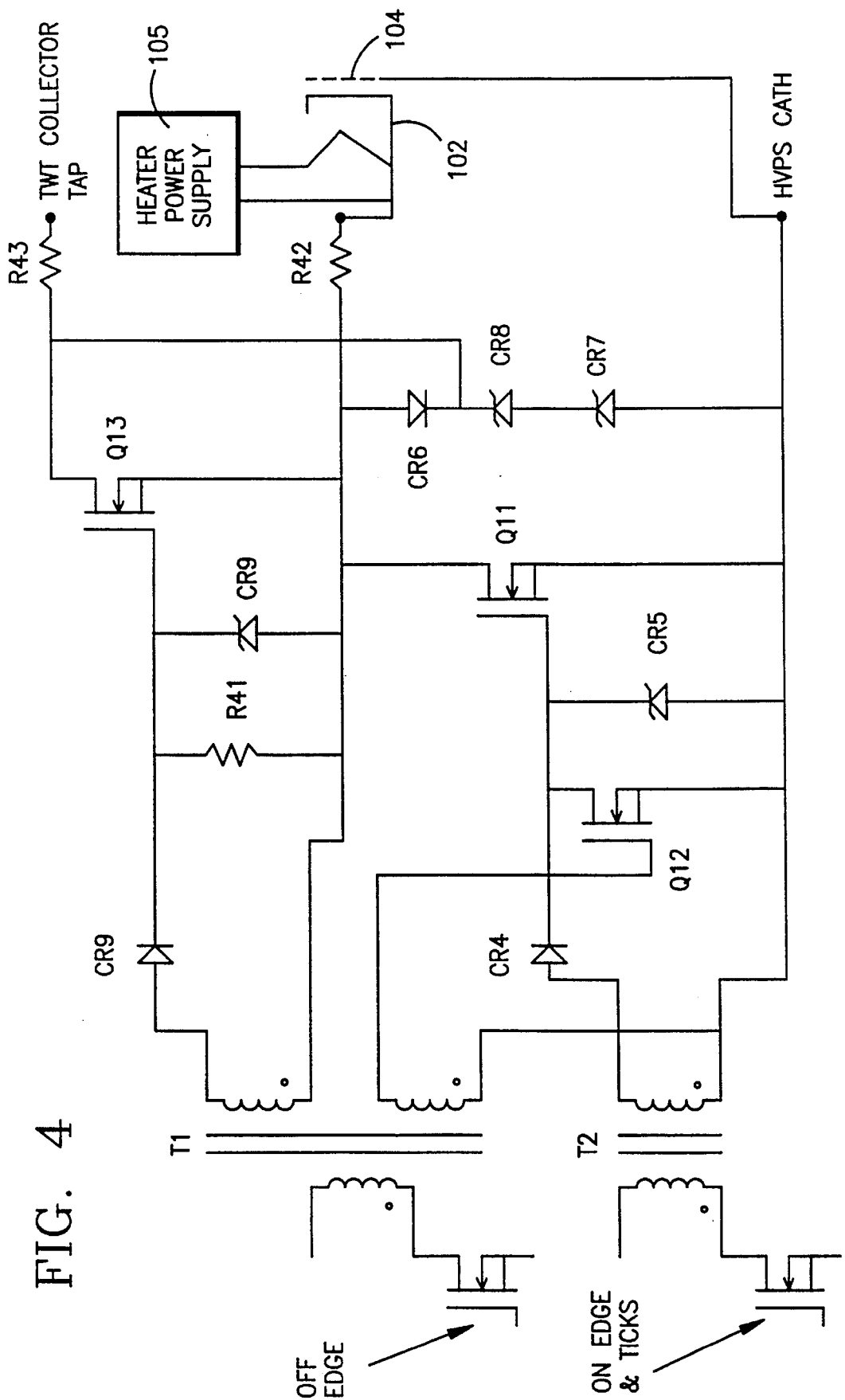
FIG. 4 is a schematic circuit diagram showing details of a particular preferred implementation of the cathode pulse modulation switch schematically illustrated in FIG. 3.

Details of a particularly advantageous implementation of the preferred pulse modulation switch, which includes both on and off switches, are shown in FIG. 4. Switch S1 preferably takes the form of a metal oxide semiconductor field effect transistor (MOSFET) Q11 connected between the power supply cathode (HVPS CATH) and the transmitter tube cathode (TWT CATH), the transmitter tube being a travelling wave tube in this embodiment, although it will be appreciated by those skilled in the art that the transmitter tube may take a variety of forms depending on the specific application in which it is used. The gate of the main "on" transistor Q11 is controlled by an on-edge pulse and maintained by ticks (a series of low amplitude, high frequency pulses) supplied via transformer T2 through a diode CR4. The use of MOSFETs is advantageous because of their rapid (nanosecond) turn-on times.

When an on-edge pulse is supplied via transformer T2, through diode CR4, the voltage across zener diode CR5 rises toward its zener voltage, and thereby establishes a bias voltage for the gate of the transistor Q11, short circuiting the drain and source of the transistor and rapidly bringing the transmitter tube cathode (TWT CATH) voltage to the HVPS cathode potential. On the other hand, when the control pulse is absent, the transmitter tube is self-biased to the cut-off voltage due to the essentially infinite resistance of the turned-off transistor Q11, the cathode voltage being limited by zeners CR7 and CR8.

Those skilled in the art will appreciate that transistor Q11 could by itself be used to control the cathode potential and provide a number of advantages over conventional control electrode modulation arrangements. Preferably, however, a second switch in the form of MOSFET Q13, which also has a nanosecond turn-on time, is provided to connect the TWT cathode to a collector tap (TWT collector) and thereby provide an off-edge response for the modulation circuit as best illustrated in FIG. 3B. Transistor Q13 is switched on by the off-edge of control pulses supplied through transformer T1 via diodes CR8 and CR9 and resistor R41, the voltage drop across the zener diode CR9 causing a bias voltage to be present at the gate of the transistor, short circuiting the source and drain of the transistor, and thereby connecting together resistors R41 and R42 and the collector and cathode in order to bring the cathode to the cut-off voltage during the turn-off period for the main on transistor Q11.

In the preferred embodiment of the invention, off edge performance is also improved by connecting a second secondary winding of the off transformer T1 to supply a bias voltage to the gate of a third MOSFET Q12, connected in parallel with the zener diode CR5 to short circuit the bias voltage across the source and gate of transistor Q11 immediately upon activation of transistor switch Q13.

Those skilled in the art will appreciate that the above described embodiments of the invention provides not only an improved apparatus for pulse modulating a transmitter tube output, but also an improved method of doing so. The preferred method involves selectively closing a switch connected between the cathode power supply and the cathode of the transmitter tube to bring the cathode voltage to that of the beam controlling element, which causes beam current to flow, and opening the switch to self-bias the tube to provide a high equivalent cathode resistance, which self-biases the tube in the cut-off region.

In addition, the preferred method optionally involves the step of controlling a second switch to improve the off-edge characteristics of the output pulse by accelerating the return of the cathode to the cutoff potential relative to the control electrode, and the step of switching on a third transistor simultaneously with the step of turning on the second transistor so as to immediately short-circuit the first transistor's bias circuitry.

Having thus described a preferred embodiment of the invention in sufficient detail to enable those skilled in the art to make and use the invention, it will be appreciated that numerous variations and modifications of the illustrated embodiment may be made without departing from the spirit and scope of the invention. As a result, it is intended that the invention not be limited to the embodiments disclosed, but rather that the invention be limited solely in accordance with the appended claims.

We claim:

1. In pulse modulation apparatus for a transmitter tube of the type having a cathode, a cathode power supply, and at least one control electrode, and wherein, when the control electrode and cathode are at the same potential, the transmitter tube is switched on, and when the control electrode potential differs from the cathode potential by a predetermined value referred to hereinafter as the transmitter tube cutoff voltage, the transmitter tube is switched off, the improvement comprising:

means for connecting the control electrode of the transmitter tube to a terminal of the cathode power supply; and means including a main on switch for selectively connecting the cathode to said terminal of the cathode power supply and thereby cause the transmitter tube cathode to be at the same potential as the control electrode when the switch is closed, and for disconnecting the cathode from said terminal of the cathode power supply to provide a very high equivalent cathode resistance which self-biases the transmitter tube in the cut-off region, thereby causing the potential difference between the control electrode and the transmitter tube cathode to return to the transmitter tube cutoff voltage when the switch is open.

2. Apparatus as claimed in claim 1, wherein the main on switch is of the type having a relative slow turn off time in comparison with its turn-on time, and further comprising an off switch having a turn-on time which is sufficiently fast to accelerate the return of the cathode to the cutoff voltage during turn-off of the main on switch.

3. Apparatus as claimed in claim 2, wherein said off switch is connected between the cathode and a collector tap on the cathode power supply.

4. Apparatus as claimed in claim 2, wherein the on and off switches respectively include first and second field effect transistors having drains respectively connected to the transmitter tube cathode and the power supply collector, and sources respectively connected to the power supply cathode and the transmitter tube cathode, and wherein the gate electrode of the first transistor is connected to an on-signal supply and to an off-signal supply, and wherein the gate electrode of the second transistor is connected to the off signal supply, such that when the on-signal is supplied, the first transistor is turned on, and when the off-signal is supplied, the first transistor is turned off and the second transistor is turned on.

5. Apparatus as claimed in claim 4, further comprising a third field effect transistor having source and drain electrodes connected between the gate and source electrodes of the first transistor and a gate electrode connected to the off signal source to accelerate the turn off time of the first transistor.

6. Apparatus as claimed in claim 5, wherein said on and off signal supplies include first and second transformers, the secondary winding of a first of said transformers being connected to a gate bias circuit of the first transistor, and respective first and second secondary windings of the second transformer being respectively connected to gate bias circuits of the second and third transistors.

7. Apparatus as claimed in claim 1, further comprising an off switch connected between a tap on the cathode power supply and the cathode, said off switch forming means for reducing the cutoff voltage of the transmitter tube as a result of the voltage drop across the off switch when the off switch is closed.

8. In a method of pulse modulating a transmitter tube of the type having a cathode and at least one control electrode, and wherein, when the control electrode and cathode are at the same potential, the transmitter tube is switched on, and when the control electrode potential differs from the cathode potential by a predetermined value referred to hereinafter as the transmitter tube cutoff voltage, the transmitter tube is switched off, the improvement comprising the steps of:

connecting the control electrode of the transmitter tube to a terminal of the cathode power supply; and selectively closing a switch connected between the cathode and a cathode power supply to connect the cathode to the cathode power supply and thereby cause the transmitter tube cathode to be at the same potential as the control electrode, and opening the switch to disconnect the cathode from the cathode power supply to provide a very high equivalent cathode resistance which self-biases the transmitter tube in the cut-off region and thereby causes the potential difference between the control electrode and the transmitter tube cathode to return to the transmitter tube cutoff voltage.

9. A method as claimed in claim 8, further comprising the step of closing an switch connected between the cathode and a collector tap on the cathode power supply upon opening of the main on switch to thereby accelerate return of the cathode to the cutoff voltage when the on switch is opened.

10. A method as claimed in claim 9, further comprising the step of turning on a third switch to short-circuit a control electrode of the on switch simultaneous with the supply of an on signal for closing the off switch.

* * * * *